United States Patent [19]

Staudinger et al.

[11] Patent Number: 5,023,576

[45] Date of Patent: Jun. 11, 1991

[54] BROADBAND 180 DEGREE HYBRID

[75] Inventors: Joseph Staudinger; Warren L. Seely, both of Chandler, Ariz.

[73] Assignee: Motorola, Inc., Schaumburg, Ill.

[21] Appl. No.: 445,307

[22] Filed: Dec. 4, 1989

[51] Int. Cl.$^5$ .................. H03H 7/21; H03H 7/48
[52] U.S. Cl. .................. 333/118; 333/121; 333/25; 333/100
[58] Field of Search .................. 333/100, 117–119, 333/121–123, 129, 132, 25, 26, 138

[56] References Cited

U.S. PATENT DOCUMENTS

| | | | |
|---|---|---|---|
| 2,076,248 | 4/1937 | Norton | 333/129 |
| 2,771,518 | 11/1956 | Sziklai | 333/132 X |
| 3,017,584 | 1/1962 | Lundry | 333/132 |
| 4,578,652 | 3/1986 | Sterns | 333/117 |
| 4,851,795 | 7/1989 | Beckwith | 333/118 X |

*Attorney, Agent, or Firm*—Frank J. Bogacz; Jordan C. Powell

*Primary Examiner*—Paul Gensler

[57] ABSTRACT

A broadband 180 degree hybrid having lumped or semi-lumped elements is comprised of a network of low and high pass filters. A 180 degree phase differential is obtained by splitting an input signal from a first input. A first portion of the split signal is passed through a low pass filter and a second portion is passed through a high pass filter. The phase differential is maintained at 180 degrees. A zero (0) degree phase differential is obtained by splitting an input signal from a second input and passing both portions through a pair of low pass filters or through a pair of high pass filters.

9 Claims, 1 Drawing Sheet

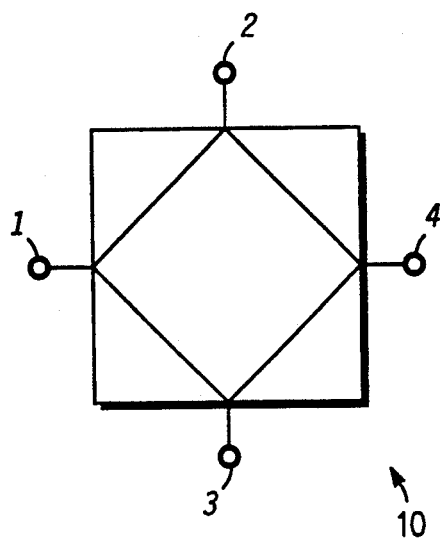
FIG. 1
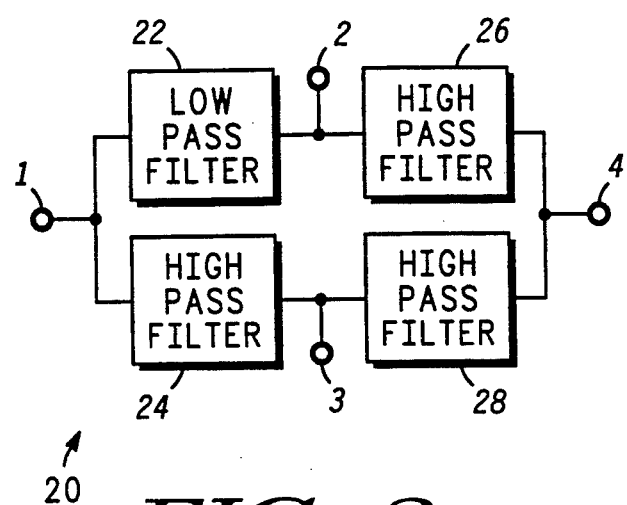
FIG. 2
FIG. 3
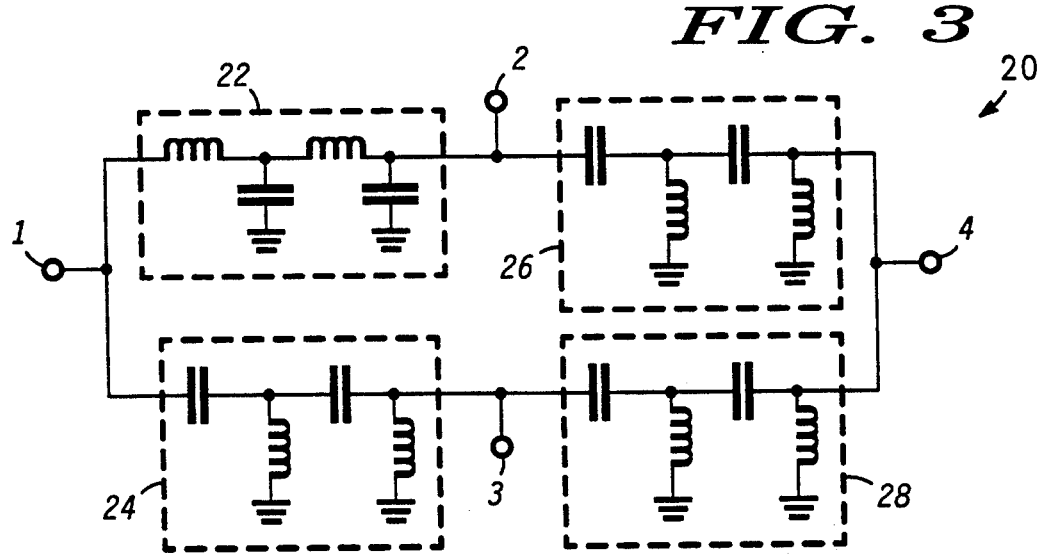
FIG. 4
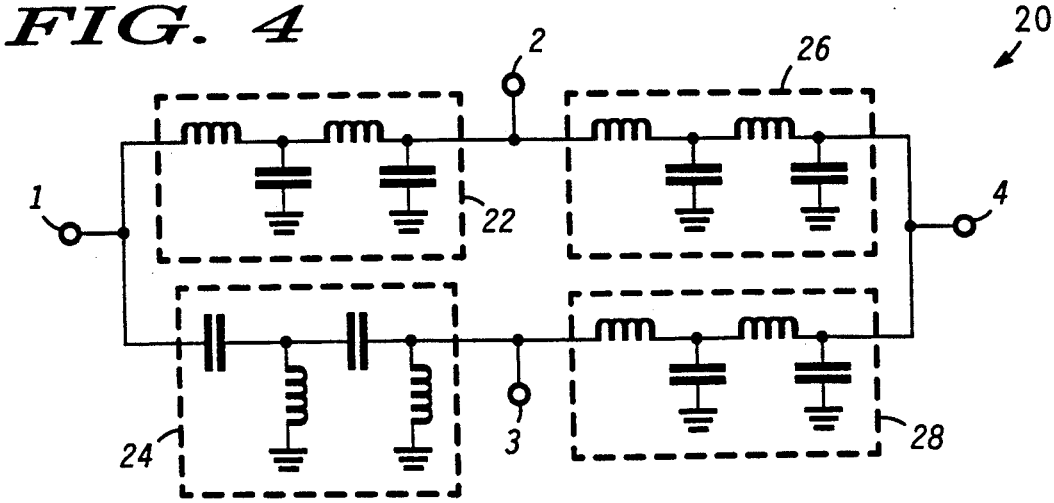

BROADBAND 180 DEGREE HYBRID

BACKGROUND OF THE INVENTION

This invention relates, in general, to hybrids, and more specifically, to broadband 180 degree hybrids.

Broadband 180 degree hybrids are commonly used in many analog and RF/microwave components. Such hybrids form basic building blocks in constructing components including balanced mixers, balanced amplifiers for improved second order IMD (intermodulation distortion) performance, and general networks which transition power from a balanced to an unbalanced condition as used in antennas.

Most broad bandwidth hybrids (on the order of an octave or greater) are constructed using either ferrite material or transmission lines. Ferrite hybrids, constructed of toroidal ferrite, are generally used in frequencies below 500 MHz. As frequencies increase, ferrite hybrids experience a decrease in Q value. Transmission line construction is favored for high frequencies due to the high Q which transmission lines exhibit. The transmission lines operate as broadside coupled lines on suspended substrata.

While both types of 180 degree hybrids are widely used, neither is compatible with MMIC (monolithic microwave integrated circuit) technology. MMIC circuits favor lumped or semi-lumped networks of capacitors, inductors, resistors, and, in some cases, short transmission lines. Although some MMIC circuits have been constructed using lumped or semi-lumped elements, such circuits have almost invariably been limited to narrow bandwidths of around 10 to 20% of the center frequency or fractional bandwidth.

SUMMARY OF THE INVENTION

Accordingly, it is an object of the present invention to provide a broadband 180 degree hybrid which is compatible with MMIC technology.

A broadband 180 degree hybrid having lumped or semi-lumped elements is comprised of a network of low and high pass filters. A 180 degree phase differential is obtained by splitting an input signal from a first input. A first portion of the split signal is passed through a low pass filter and a second portion is passed through a high pass filter. The phase differential is maintained at 180 degrees. A zero (0) degree phase differential is obtained by splitting an input signal from a second input and passing both portions through a pair of low pass filters or through a pair of high pass filters.

The above and other objects, features, and advantages of the present invention will be better understood from the following detailed description taken in conjunction with the accompanying drawings.

BRIEF DESCRIPTION OF THE DRAWING

FIG. 1 is a general schematic of the operation of a generalized 180 degree hybrid.

FIG. 2 is a general schematic of a 180 degree hybrid according to the present invention.

FIG. 3 is a detailed schematic of a 180 degree hybrid according to a first embodiment of the present invention.

FIG. 4 is a detailed schematic of a 180 degree hybrid according to a second embodiment of the present invention.

DETAILED DESCRIPTION OF THE INVENTION

FIG. 1 shows an ideal 180 degree hybrid 10. One hundred eighty degree hybrids are four (4) port devices. For hybrid 10 of FIG. 1, a signal input at terminal 1 is split and output at terminals 2 and 3 with the output signals exhibiting a 180 degree phase differential. No signal is present at terminal 4. The signals at terminals 2 and 3 are equal in amplitude. A signal input at terminal 4 is split equally between terminals 2 and 3 and the two output signals have no phase differential and have equal amplitudes. There is complete isolation between terminals 1 and 4. The mathematical description of hybrid 10 is as follows.

First:

$$S_{11}, S_{22}, S_{33}, S_{44} = 0$$

where $S_{xx}$ are scattering parameters. $S_{11}$, $S_{22}$, $S_{33}$, and $S_{44}$ are proportional to the power reflected at the terminals when an incident signal is applied at terminals 1, 2, 3, and 4 respectively.

Second:

$$S_{21}/S_{31} = 1 \text{ at 180 degrees}$$

where $S_{21}$ represents the power transfer from terminal 1 to terminal 2, and $S_{31}$ represents the power transfer from terminal 1 to terminal 3.

Third:

$$S_{24}/S_{34} = 1 \text{ at 0 degrees}$$

where $S_{24}$ represents the power transfer from terminal 4 to terminal 2, and $S_{34}$ represents the power transfer from terminal 4 to terminal 3.

Finally:

$$S_{14}, S_{41}, S_{23}, S_{32} = 0$$

where $S_{14}$, $S_{41}$, $S_{23}$, and $S_{32}$ are representative of the isolation between the respective terminals.

FIG. 2 shows a lumped element 180 degree hybrid 20 which is designed according to the above mathematical descriptions for hybrid 10 of FIG. 1. Hybrid 20 comprises four filters: 22, 24, 26, and 28. If filter 22 is a low pass filter, as shown in the embodiment of FIG. 2, filters 24, 26, and 28 will be high pass filters. If filter 22 is a high pass filter, filters 24, 26, and 28 will be low pass filters. It should be recognized that, following the above reasoning, filter 24 may be a low pass filter with filters 22, 26, and 28 as high pass filters.

A signal input at terminal 1 will be split into equal amplitudes and output at terminals 2 and 3 with a 180 degree phase differential. At center frequency, the phase of the outputs at terminals 2 and 3 are +90 degrees or −90 degrees. As the signal deviates from center frequency, the phase of the signals at terminals 2 and 3 varies from ±90 degrees, but the total phase differential remains 180 degrees. A signal input at terminal 4 will be split into equal amplitudes and output at terminals 2 and 3 with 0 degree phase differential.

The complementary nature of the filter networks enables hybrid 20 to perform over a wide bandwidth. In fact, hybrid 20 operates in excess of a 3:1 bandwidth or fractional bandwidth of approximately 115%, greatly outperforming the present 10 to 20 percent bandwidths of other lumped element hybrids.

Hybrid 20 also operates in a combining mode. When signals are incident at terminals 2 and 3, the signals are combined vectorially (per the respective phases and amplitudes) and are output through terminals 1 and/or 4. Similarly, incident signals at terminals 1 and 4 are combined and output through terminals 2 and/or 3. For example, incident voltage signals having amplitudes of 1 and phase angles of zero degrees at terminals 2 and 3 are combined vectorially and are output at terminal 4. No signal will exit terminal 1 since terminal 1 is isolated when equal phase/amplitude signals are incident at terminals 2 and 3.

Hybrid 20 may be constructed from lumped elements, or semi-lumped elements having short lengths of transmission lines. The values of the elements at 180 degrees may be determined from the following criteria. For the low pass filter(s), the phase response of the insertion characteristic is defined as:

$$p(s) = s^4 + b_3 s^3 + b_2 s^2 + b_1 s + b_0$$

where p(s) is the Hurwitz polynomial and s is the frequency variable of the low pass network. The phase response is then determined as:

$$Arg[p(s)] = \tan^{-1}\left[\frac{Im[p(s)]}{Re[p(s)]}\right]$$

where Arg represents argument, Im represents imaginary, and Re represents real.

The phase response for the high pass filter(s) can be developed by transforming the low pass network with a scaling factor A. In the above phase response "s" becomes A/s and the high pass filter phase response is:

$$Arg[p(s)] = \tan^{-1}\left[\frac{Im[p(A/s)]}{Re[p(A/s)]}\right].$$

The phase differential is the low pass phase response minus the high pass phase response.

A further design constraint for the low and high pass filters is that the passbands must share a common frequency range. This constraint ensures an equal amplitude split at terminals 2 and 3. If the filter impedances are unequal, the amplitude at terminals 2 and 3 will be unequal.

From the above constraints, a set of criteria can be established to design the low and high pass filters. The criteria includes:

a. The cut-off frequencies of each filter must be such as to provide a common passband.

b. The filter order, response (e.g. Butterworth, Chebyshev), and constituent parameters must be chosen to satisfy the phase criteria.

FIGS. 3 and 4 show hybrid 20 in its preferred embodiments designed according to the above criteria. The filters 22 through 28 utilize fourth order Chebyshev high and low pass filters. FIG. 3 shows hybrid 20 where filter 22 is a fourth order Chebyshev low pass filter and filters 24, 26, and 28 are all fourth order Chebyshev high pass filters. FIG. 4 shows hybrid 20 where filter 24 is a fourth order Chebyshev high pass filter and filters 22, 26, and 28 are all fourth order Chebyshev low pass filters.

By utilizing the lumped element construction of FIGS. 3 and 4, hybrid 20 can be easily incorporated in MMIC circuitry.

Thus there has been provided, in accordance with the present invention, a broadband 180 degree hybrid that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A 180 degree hybrid comprising:
first means for splitting a first input signal;
a first plurality of phase shifting means for generating a 180 degree phase differential between said split first input signal;
said first means coupled to a first input to receive said first input signal and coupled to said first plurality of phase shifting means to relay said split first input signals to said first plurality of phase shifting means;
said first plurality of phase shifting means coupled to a plurality of outputs;
said first plurality of phase shifting means comprising a high pass filter;
second means for splitting a second input signal;
a second plurality of phase shifting means for generating a substantially 0 degree phase differential between said split second signals;
said second means coupled to a second input to receive said second input signal and coupled to said second plurality of phase shifting means to relay said split second input signals to said second plurality of phase shifting means; and
said second plurality of phase shifting means coupled to said plurality of outputs.

2. A 180 degree hybrid according to claim 1 wherein said second plurality of phase shifting means comprises a plurality of high pass filters.

3. A 180 degree hybrid according to claim 1 wherein said second plurality of phase shifting means comprises a plurality of low pass filters.

4. A 180 degree hybrid comprising:
first mens for splitting a first input signal;
a plurality of phase shifting means for generating a 180 degree phase differential between said split first input signals;
said first means coupled to a first input to receive said first input signal and coupled to said plurality of phase shifting means to relay said split first input signals to said plurality of phase shifting means;
said plurality of phase shifting means coupled to a plurality of outputs;
said plurality of phase shifting means comprising a high pass filter;
second means for splitting a second input signal;
said second means coupled to a second input to receive said second input signal;
means for generating a substantially 0 degree phase differential in said split second input signals; and
said means for generating coupled to said second means to receive said split second input signals and coupled to said plurality of outputs to output said split second input signals with said substantially 0 degree phase differential.

5. A 180 degree hybrid according to claim 4 wherein said plurality of phase shifting means further comprises a low pass filter.

6. A 180 degree hybrid according to claim 4 wherein said means for generating a substantially 0 degree phase differential comprises a plurality of high pass filters.

7. A 180 degree hybrid according to claim 4 wherein said means for generating a substantially 0 degree phase differential comprises a plurality of low pass filters.

8. A 180 degree hybrid comprising:
first, second, third and fourth terminals;
a low pass filter;
a plurality of high pass filters;
said low pass filter and a first of said plurality of high pass filters coupled to said first terminal;
said first terminal receiving a first input signal and splitting said first input signal between said low pass filter and said first of said plurality of high pass filters;
said low pass filter and a second of said plurality of high pass filters coupled to said second terminal;
said first of said plurality of high pass filters and a third of said plurality of high pass filters coupled to said third terminal;
said low pass filter and said first of said plurality of high pass filters outputting said split first input signal to said second and third terminals with a substantially 180 degree phase differential;
said second and third of said plurality of high pass filters coupled to said fourth terminal;
said fourth terminal receiving a second input signal and splitting said second input signal between said second and third of said plurality of high pass filters; and
said second and third of said plurality of high pass filters outputting said split second input signal to said second and third terminals with a substantially 0 degree phase differential.

9. A 180 degree hybrid comprising:
first, second, third and fourth terminals;
a high pass filter;
a plurality of low pass filters;
said high pass filter and a first of said plurality of low pass filters coupled to said first terminal;
said first terminal receiving a first input signal and splitting said first input signal between said high pass filter and said first of said plurality of low pass filters;
said high pass filter and a second of said plurality of low pass filters coupled to said second terminal;
said first of said plurality of low pass filters and a third of said plurality of low pass filters coupled to said third terminal;
said high pass filter and said first of said plurality of low pass filters outputting said split first input signal to said second and third terminals with a substantially 180 degree phase differential;
said second and third of said plurality of low pass filters coupled to said fourth terminal;
said fourth terminal receiving a second input signal and splitting said second input signal between said second and third of said plurality of low pass filters; and
said second and third of said plurality of low pass filters outputting said split second input signal to said second and third terminals with a substantially 0 degree phase differential.

* * * * *